United States Patent
Abe et al.

(10) Patent No.: US 10,068,858 B2
(45) Date of Patent: Sep. 4, 2018

(54) COMPOUND SEMICONDUCTOR SUBSTRATE

(71) Applicant: COORSTEK KK, Shinagawa-ku, Tokyo (JP)

(72) Inventors: Yoshihisa Abe, Hadano (JP); Kenichi Eriguchi, Hadano (JP); Noriko Omori, Hadano (JP); Hiroshi Oishi, Hadano (JP); Jun Komiyama, Hadano (JP)

(73) Assignee: COORSTEK KK, Tokyo (JP)

( * ) Notice: Subject to any disclaimer, the term of this patent is extended or adjusted under 35 U.S.C. 154(b) by 141 days.

(21) Appl. No.: 15/284,781

(22) Filed: Oct. 4, 2016

(65) Prior Publication Data

US 2017/0110414 A1  Apr. 20, 2017

(30) Foreign Application Priority Data

Oct. 14, 2015 (JP) .................. 2015-202862

(51) Int. Cl.
*H01L 31/0256* (2006.01)
*H01L 23/00* (2006.01)
(Continued)

(52) U.S. Cl.
CPC .......... *H01L 23/562* (2013.01); *C30B 25/183* (2013.01); *C30B 29/406* (2013.01);
(Continued)

(58) Field of Classification Search
CPC ............. H01L 23/562; H01L 21/02389; H01L 21/02458; H01L 21/0262; H01L 22/12;
(Continued)

(56) References Cited

U.S. PATENT DOCUMENTS

2002/0096106 A1   7/2002   Kub et al.
2011/0057165 A1   3/2011   Pinnington
(Continued)

FOREIGN PATENT DOCUMENTS

DE   102012201917 A1   8/2012
JP   2006-315951 A     11/2006
(Continued)

OTHER PUBLICATIONS

Search Report and Written Opinion issued in corresponding Belgian Patent Application No. 2016/05760 dated Apr. 20, 2017 (14 pages).

*Primary Examiner* — Kevin M Picardat
(74) *Attorney, Agent, or Firm* — Buchanan, Ingersoll & Rooney PC

(57) ABSTRACT

A compound semiconductor substrate according to the present invention includes a compound semiconductor layer formed on one main surface of a ground substrate via a seed layer, wherein the ground substrate is formed of a sintered body, the seed layer is formed of a single crystal, the compound semiconductor layer includes a structure having a buffer layer and an active layer that are sequentially crystal-grown on the seed layer, a thermal expansion coefficient of the sintered body is 0.7 times or more and 1.4 times or less an average thermal expansion coefficient of the entire compound semiconductor layer, and an FWHM of an X-ray diffraction peak of the buffer layer obtained by an X-ray diffraction rocking curve measurement is 800 arcsec or less.

6 Claims, 2 Drawing Sheets

(51) Int. Cl.
*C30B 25/18* (2006.01)
*C30B 29/40* (2006.01)
*H01L 21/02* (2006.01)
*H01L 21/66* (2006.01)
*H01L 29/04* (2006.01)
*H01L 29/20* (2006.01)
*H01L 29/205* (2006.01)
*H01L 29/66* (2006.01)
*H01L 29/778* (2006.01)

(52) U.S. Cl.
CPC ...... *H01L 21/0245* (2013.01); *H01L 21/0254* (2013.01); *H01L 21/0262* (2013.01); *H01L 21/02389* (2013.01); *H01L 21/02458* (2013.01); *H01L 21/02502* (2013.01); *H01L 21/02505* (2013.01); *H01L 22/12* (2013.01); *H01L 29/045* (2013.01); *H01L 29/2003* (2013.01); *H01L 29/205* (2013.01); *H01L 29/66462* (2013.01); *H01L 29/7787* (2013.01); *H01L 21/02378* (2013.01); *H01L 21/02422* (2013.01); *H01L 29/7786* (2013.01)

(58) Field of Classification Search
CPC . H01L 29/045; H01L 29/2003; H01L 29/205; H01L 29/66462; H01L 29/7787; C30B 25/183; C30B 29/406
USPC ........................................................ 257/76
See application file for complete search history.

(56) References Cited

U.S. PATENT DOCUMENTS

| | | | |
|---|---|---|---|
| 2011/0147763 A1* | 6/2011 | Hanawa | B82Y 20/00 257/76 |
| 2011/0171812 A1* | 7/2011 | Letertre | H01L 21/187 438/458 |
| 2012/0211763 A1 | 8/2012 | Yoshida et al. | |
| 2012/0217507 A1* | 8/2012 | Ohki | H01L 29/2003 257/76 |
| 2013/0149847 A1 | 6/2013 | Satoh et al. | |
| 2014/0042447 A1* | 2/2014 | Nie | H01L 21/6835 257/76 |
| 2014/0264363 A1* | 9/2014 | Zhu | H01L 33/007 257/76 |
| 2014/0339680 A1* | 11/2014 | Merckling | H01L 21/02538 257/615 |

FOREIGN PATENT DOCUMENTS

| | | |
|---|---|---|
| JP | 2007-112633 A | 5/2007 |
| JP | 2013-258373 A | 12/2013 |
| JP | 5755390 B1 | 7/2015 |
| JP | 5756888 B2 | 7/2015 |
| WO | WO 2012/043474 A1 | 4/2012 |

* cited by examiner

COMPOUND SEMICONDUCTOR SUBSTRATE

BACKGROUND OF THE INVENTION

Field of the Invention

The present invention relates to a compound semiconductor substrate.

Description of the Related Art

When manufacturing a compound semiconductor substrate by stacking compound semiconductor layers on a ground substrate, a ground substrate having a crystal plane according to the crystal orientation of the compound semiconductor layer to be formed on one main surface is used, and examples of the ground substrate may include a silicon (Si) single crystal substrate or a sapphire single crystal substrate.

In recent years, there has been an increasing need for the compound semiconductor substrate having a larger diameter or a thicker compound semiconductor layer. However, warpage is caused when compound semiconductors are stacked on a single crystal substrate when the single crystal substrate has a larger diameter. In addition, the single crystal substrate is required to be processed in consideration of the plane orientation or toughness due to its quality of material so that the design thereof is limited. Furthermore, the cost of the single crystal substrate itself, particularly a sapphire substrate or a SiC substrate is high. Hence, it is difficult to sufficiently satisfy these requirements as long as a single crystal substrate is applied as the ground substrate.

Accordingly, it is investigated again to use a sintered body material that is easily increased in diameter and relatively inexpensive in price as a ground substrate.

JP 2006-315951 A discloses a technology that there is a thin film substrate obtained by forming a thin film composed mainly of at least one kind selected from gallium nitride, indium nitride, and aluminum nitride on a sintered body composed mainly of a ceramic material, in which the thin film is obtained by forming a single crystal thin film on at least any one selected from an amorphous thin film, a polycrystalline thin film, and an oriented polycrystalline thin film, or in which the thin film is obtained by forming a single crystal thin film on a single crystal thin film and the crystallinity of the single crystal thin film formed on the other single crystal thin film is equal or superior to the crystallinity of the other single crystal thin film.

WO 2012/043474 A1 discloses a polycrystalline aluminum nitride substrate for GaN-based semiconductor crystal growth which contains a sintering aid component at from 1 to 10 mass %, has a thermal conductivity of 150 W/m·K or more, and does not have a recess having a maximum diameter greater than 200 µm on the substrate surface as a substrate material for the grain growth of a GaN-based semiconductor.

JP 2007-112633 A discloses a nitride semiconductor wafer including a substrate that is composed of polycrystalline aluminum nitride having orientation and has a plurality of steps formed on the main surface and a single crystal nitride semiconductor layer formed on the main surface of the substrate and a nitride semiconductor element including an electrode formed on the nitride semiconductor layer for the purpose of providing a nitride semiconductor wafer and a nitride semiconductor element which are excellent in crystallinity while using a polycrystalline AlN substrate.

JP 2013-258373 A discloses a method for manufacturing a composite substrate which includes a step of preparing a sintered substrate having an average particle size of 0.1 µm or more and 30 µm or less, a step of bonding the sintered substrate with a semiconductor crystal substrate by interposing a bonding layer, and a step of forming a composite substrate in which a semiconductor crystal layer is bonded on the sintered substrate by interposing the bonding layer by separating a part of the semiconductor crystal layer from the semiconductor crystal substrate.

JP 5755390 B1 and JP 5756888 B2 disclose a technology in which a composite substrate obtained by bonding a single crystal silicon donor substrate on a handle substrate of a polycrystalline material can be applied to a power device using a compound semiconductor.

It is advantageous in terms of cost if it is possible to form a single crystal layer directly on a polycrystalline surface, but it is practically difficult to form a highly crystalline semiconductor layer on a polycrystalline surface by the technologies described in JP 2006-315951 A and WO 2012/043474 A1.

In addition, for example, in JP 2007-112633 A, it is disclosed that the c-axis is approximately parallel to the growth direction and further the a-axis or m-axis is approximately parallel or perpendicular to the extending direction of the step, and a single crystal nitride semiconductor layer can be grown on a polycrystalline AlN substrate when a plurality of steps having a height, for example, of about several nanometers are formed on the surface of a polycrystalline AlN substrate so as to be substantially parallel to each other and a nitride semiconductor is grown on this so that a single crystal layer can be formed directly on a polycrystalline surface.

However, it is greatly costly to uniformly and equally form nano-size steps over the entire one main surface of a large-size substrate and it is concerned that the steps are not uniform due to the presence of grain boundaries and voids on the polycrystalline substrate surface.

In the method as described in JP 2013-258373 A in which a semiconductor crystal layer is prepared in advance and bonded with a polycrystalline substrate via a bonding layer and a part of the semiconductor crystal layer is separated, a considerable thickness is required in the bonding step or the separation step, but the manufacturing cost increases when the material for the semiconductor crystal layer to be prepared in advance is expensive. Furthermore, in this case, it is difficult to fabricate a stacked structure of semiconductor crystal layers having different compositions and the degree of freedom in design as a semiconductor device is limited.

The inventions described in JP 5755390 B1 and JP 5756888 B2 relate to a composite substrate obtained by bonding a single crystal body on one main surface of a polycrystalline body. It is also attempted to fabricate a variety of compound semiconductor substrates by stacking a compound semiconductor layer on a composite substrate by the same method for stacking a compound semiconductor layer on a single crystal substrate as in the prior art.

Meanwhile, an excellent effect to be equal to or higher than that in the case of stacking a compound semiconductor layer on a single crystal substrate is expected in the case of applying the structure of a compound semiconductor layer of the prior art on the composite substrate. However, it is not sufficiently clarified which structure of a compound semiconductor and a composite substrate is a preferred form.

SUMMARY OF THE INVENTION

In view of the above circumstances, an object of the present invention is to provide a compound semiconductor substrate having a sintered body as a ground substrate, which is suitable for the manufacture of a compound semiconductor element exhibiting superior properties.

A compound semiconductor substrate according to the present invention includes a compound semiconductor layer formed on one main surface of a ground substrate via a seed layer, in which the ground substrate is formed of a sintered body, the seed layer is formed of a single crystal, the compound semiconductor layer has a structure in which a buffer layer and an active layer are sequentially crystal-grown on the seed layer, a thermal expansion coefficient of the sintered body is 0.7 times or more and 1.4 times or less an average thermal expansion coefficient of the entire compound semiconductor layer, and an *FWMH of an X-ray diffraction peak of the buffer layer is 800 arcsec or less. (*FWHM: full width at half maximum)

By having such a configuration, it is possible to obtain a compound semiconductor substrate that is superior in properties to those of the prior art. Specifically, the compound semiconductor substrate can exhibit excellent effect of suppressing warpage and cracks and breakdown voltage characteristics while maintaining a low resistance value.

In addition, in the compound semiconductor substrate according to the present invention, it is preferable that a layer thickness of the compound semiconductor layer be 7 µm or more and 15 µm or less.

By having such a configuration, it is possible to sufficiently secure the breakdown voltage characteristics in a longitudinal direction of the compound semiconductor substrate and to improve the electrical properties of the active layer.

Here, examples of the form of the compound semiconductor substrate according to the present invention may include a form in which the active layer is one obtained by forming an electron supply layer on an electron transit layer. In that case, it is more preferable that a spacer layer be further provided between the electron transit layer and the electron supply layer.

Moreover, a specific example of the form described above is a form in which the ground substrate is an aluminum nitride (AlN) sintered body, the seed layer is a silicon (Si) single crystal manufactured by the Czochralski (CZ) method or the Floating Zone (FZ) method, the compound semiconductor is a gallium-based nitride manufactured by a vapor phase growth method, and the FWHM of the GaN (002) and GaN (100) X-ray diffraction peaks of the buffer layer are both 500 arcsec or less.

According to the present invention, it is possible to inexpensively provide a compound semiconductor substrate which exhibits excellent effect of suppressing warpage and cracks and secures sufficient breakdown voltage characteristics while maintaining a low resistance value.

DESCRIPTION OF THE EMBODIMENTS

Figure 1:
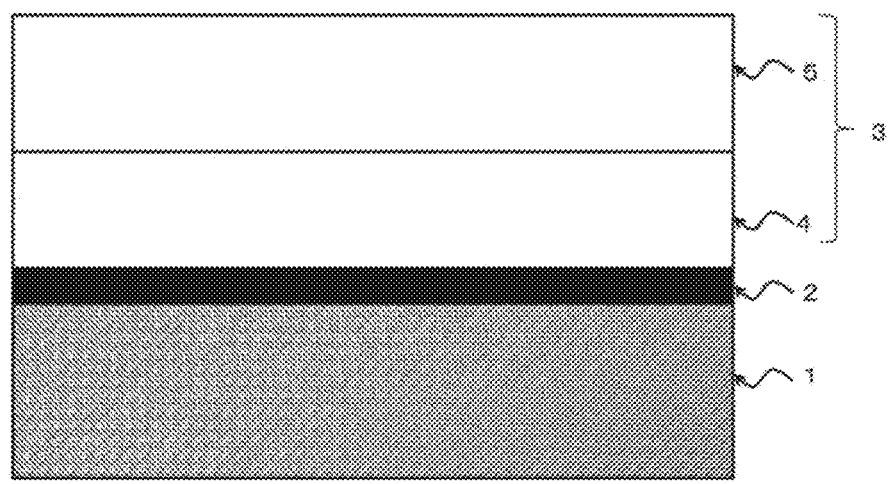
FIG. 1 is a cross-sectional schematic diagram which illustrates one embodiment of a compound semiconductor substrate according to the present invention.

Hereinafter, the present invention will be described in detail with reference to the accompanying drawings.

A compound semiconductor substrate Z according to the present invention includes a compound semiconductor layer 3 formed on one main surface of a ground substrate 1 via a seed layer 2, in which the ground substrate 1 is composed of a sintered body, the seed layer 2 is composed of a single crystal, the compound semiconductor layer 3 has a structure in which a buffer layer 4 and an active layer 5 are sequentially crystal-grown on the seed layer 2, the thermal expansion coefficient of the sintered body is 0.7 times or more and 1.4 times or less the average thermal expansion coefficient of the entire compound semiconductor layer 3, and an FWHM of the X-ray diffraction peak of the buffer layer 4 is 800 arcsec or less.

FIG. 1 is a cross-sectional schematic diagram which illustrates one embodiment of the compound semiconductor substrate Z according to the present invention. That is, in the compound semiconductor substrate Z, the seed layer 2 and the compound semiconductor layer 3 are sequentially formed on one main surface of the ground substrate 1 and the compound semiconductor layer 3 includes a structure in which the buffer layer 4 and the active layer 5 are stacked in this order. Incidentally, FIG. 1 is merely a conceptual diagram, and the actual dimension ratios of the respective layers are different.

In the present invention, the ground substrate 1 is a sintered body. In the prior art, a single crystal has been suitably used in the ground substrate, but the reason for this is because the compound semiconductor layer formed on the ground substrate inherits the crystallinity of the single crystal so as to obtain the crystallinity in the level required as a semiconductor element.

From this point of view, the other portions of the ground substrate 1 are not necessarily required to be a single crystal as long as only the vicinity of one main surface on which the compound semiconductor layer is formed is a single crystal.

Hence, in the present invention, a sintered body is used in the ground substrate 1 and only the vicinity of the one main surface of the ground substrate 1 is provided with the seed layer composed of a single crystal so as to allow the compound semiconductor layer 3 to inherit the crystallinity of the single crystal. That is, in the present invention, the seed layer 2 guarantees the region of the single crystal to secure the crystallinity of the compound semiconductor layer 3 and the ground substrate 1 is composed of a sintered body. When compared to the same materials, a sintered body substrate is firstly superior to a single crystal substrate in terms of a lower price and easier manufacture into a large-size substrate.

In addition, a sintered body has a greater degree of freedom in selection of the material than a single crystal, and a material having a smaller difference in thermal expansion coefficient from the compound semiconductor layer can be appropriately applied. Furthermore, the effect of decreasing warpage of the entire substrate is superior to the case of using one single crystal material in the ground substrate.

In addition, the ground substrate 1 composed of a sintered body is also advantageous in that it is easier to secure the bonding strength when the ground substrate 1 is bonded with the seed layer 2 composed of a single crystal as compared to the case of bonding single crystal substrates to each other.

As the material for the sintered body to be used as the ground substrate 1, known materials to be used as a semiconductor can be widely applied. The manufacturing method thereof is not also particularly limited. Examples of the material may include silicon nitride ($Si_3N_4$), aluminum nitride (AlN), silicon carbide (SiC), and boron nitride (BN). In addition, the substrate 1 does not necessarily have a homogeneous single composition, but the composition or the impurity concentration may be partially different in the substrate 1.

Incidentally, in the case of using a sintered body of AlN in the ground substrate 1, it is even more preferable to contain yttrium aluminum garnet (YAG) in AlN at from 0.5 to 5 wt % since the thermal conductivity of the ground substrate 1 is improved.

The ground substrate 1 is not required to be entirely a sintered body, and it may be a composite substrate having a single crystal layer or a variety of sintered body layers in the middle or on the back surface of the ground substrate 1, but a form consisting only of a sintered body having a single composition is preferable when priority is given to obtaining homogeneous properties as the compound semiconductor substrate Z.

Next, the seed layer 2 is formed on one main surface of the ground substrate 1. This seed layer 2 is composed of a single crystal, and it has a role as a growth seed of the compound semiconductor layer 3 to be formed thereon. In the present invention, it is intended to obtain a compound semiconductor layer of high quality by providing a seed layer composed of a single crystal by taking that it is practically difficult to form a highly crystalline single crystal layer on a sintered body surface into consideration.

In this seed layer 2, the other regions are not required to be all a single crystal as long as at least a part of the region that is in contact with the compound semiconductor layer 3 is a single crystal, and the seed layer 2 may have a variety of multilayer structures in which a part thereof is polycrystalline or amorphous. However, a form consisting only of a single crystal having a single composition is more preferable when priority is given to the homogeneous properties of the compound semiconductor substrate Z.

As a specific example of the seed layer 2, a bulk Si single crystal formed by the CZ method or the FZ method or a Si layer formed on a bulk single crystal by a CVD method is suitable. Although a single crystal of SiC, gallium nitride (GaN), or sapphire is usable, Si is superior to the various materials described above in terms of cost or ease of processability.

The thickness of the seed layer 2 is timely set depending on the selection of respective materials for the ground substrate 1, the seed layer 2, and the compound semiconductor layer 3, and the properties required for the compound semiconductor substrate Z.

The thickness of the seed layer 2 is preferably 0.05 μm or more at a minimum from the viewpoint of securing a thickness essential for the crystal growth of the compound semiconductor layer 3, but it is preferably 2 μm or less since the seed layer 2 itself may cause warpage of the compound semiconductor substrate Z when it is too thick. The thickness is more preferably from 0.1 to 1 μm.

The compound semiconductor layer 3 has a structure in which the buffer layer 4 and the active layer 5 are sequentially crystal-grown on the seed layer 2. As described above, the compound semiconductor layer 3 is one that is crystal-grown on the seed layer 2 having a single crystal surface in order to secure the crystallinity.

The compound semiconductor substrate Z may be provided with an insulating film, an electrode, a passivation film, and the like of other constituents or may have a recess structure, through structure, or the like as long as it includes a structure in which the buffer layer 4 and the active layer 5 are sequentially stacked.

The layer structure, thickness, dopant concentration, band gap (energy difference), and the like of the active layer 5 can be timely set depending on the required specification.

In addition, the active layer 5 may be one that includes a layer from which desired properties are obtained as electrons move. Examples of the layer may include alight emitting layer in the case of a light emitting diode and an electron transit layer in the case of a field effect transistor such as a high electron mobility transistor (HEMT), and it is also applicable to a radio frequency device other than these.

In the present invention, the thermal expansion coefficient of the sintered body to be used in the ground substrate 1 is 0.7 times or more and 1.4 times or less the average thermal expansion coefficient of the compound semiconductor layer 3. It is possible to decrease warpage of the entire compound semiconductor substrate Z as the thermal expansion coefficient is set in this range.

As the average thermal expansion coefficient of the compound semiconductor layer 3, a value obtained by dividing the respective thermal expansion coefficients of the buffer layer 4, the active layer 5, and other layers that are additionally provided by the thickness of each layer occupying in the total thickness of the compound semiconductor layer 3 and summing the resultant values is adopted.

By setting the thermal expansion coefficient of the sintered body to be 0.7 times or more and 1.4 times or less the average thermal expansion coefficient of the compound semiconductor layer 3, it is possible to sufficiently decrease warpage of the compound semiconductor substrate Z, for example, as compared to the case of applying Si to the ground substrate 1.

Incidentally, warpage of the entire compound semiconductor substrate Z is also affected by the ratio of the thickness of the compound semiconductor layer 3 to the thickness of the ground substrate 1, but in the present invention, the thickness of them is not required to be particularly strictly limited because the thickness of the ground substrate 1 is much thicker than that of the compound semiconductor layer 3.

For example, when the ground substrate 1 is an AlN sintered body and the compound semiconductor layer 3 is GaN, the thickness of the ground substrate 1 may be 300 μm or more in a case in which the thickness of the compound semiconductor layer 3 is 7 μm or more and 15 μm or less and particularly 7 μm or more and 12 μm or less. However, the upper limit is preferably 1200 μm or less since there are disadvantages that the handling property deteriorates, the materials to be used in the vapor phase growth apparatus is limited, and the like although the warpage decreasing effect is saturated when the ground substrate 1 is too thick.

Moreover, the FWHM of the X-ray diffraction peak of the buffer layer 4 according to the present invention is 800 arcsec or less. That is, it is possible to effectively improve the electrical properties of the compound semiconductor layer to be formed on the buffer layer 4 when the crystallinity of the buffer layer 4 is in a certain favorable level or higher.

In the present invention, the FWHM of the X-ray diffraction peak is used as an indicator to determine the suitability of crystallinity. As the method for measuring the FWHM, a known method to be applied in the evaluation of the semiconductor crystal is used.

Incidentally, the FWHM has different values depending on the target crystal orientation and it is also timely selected if necessary that the value of which crystal orientation is adopted, but at any rate, in the present invention, it is possible to significantly improve the electrical properties of the compound semiconductor layer to be formed on the buffer layer 4 when the crystallinity is 800 arcsec or less as an absolute value.

The structure of the buffer layer 4 is not particularly limited, and a known compound semiconductor stacked structure can be widely applied. In the prior art, the dislocation or warpage is controlled by employing a multilayer laminate as the buffer layer, but in the present invention, it is possible to design the buffer layer 4 with an emphasis on securing the crystallinity since the buffer layer 4 is not responsible for the effect described above by the presence of the ground substrate 1 and the seed layer 2.

Hence, it can be said that a layer structure that is simpler and is likely to provide higher crystallinity, for example, a single layer of a single material or a multilayer laminate having the stacking number of less than 10 layers is more preferable.

The seed layer 2 has a function to secure the crystal orientation and crystallinity of the buffer layer 4, but in the present invention, it also has a function to more effectively alleviate the stress caused by the difference in thermal expansion coefficient between the ground substrate 1 and the compound semiconductor layer 3. Incidentally, the effect described above is more appropriately exerted by optimizing each layer thickness in consideration of the thermal expansion coefficient or lattice constant of each of the ground substrate 1, the seed layer 2, and the compound semiconductor layer 3.

In the compound semiconductor substrate Z of the present invention, the layer thickness of the compound semiconductor layer 3 is preferably 7 μm or more and 15 μm or less. In the present invention, it is possible to obtain an active layer 5 of high quality by providing the ground substrate 1 and the buffer layer 4. Furthermore, the breakdown voltage characteristics in the longitudinal direction can be sufficiently secured and the electrical characteristics of the active layer 5 are synergistically improved regardless of the kind of compound semiconductor by setting the layer thickness of the compound semiconductor layer 3 to 7 μm or more.

On the other hand, the breakdown voltage characteristics can be improved as the thickness of the compound semiconductor layer 3 is thicker, but the layer thickness is limited to 15 μm or less. The reason is that it is a set value in view of the practical breakdown voltage and the deterioration of properties other than the breakdown voltage is also considered.

Moreover, in the compound semiconductor substrate Z of the present invention, the active layer 5 is suitably one in which an electron supply layer 5b is formed on an electron transit layer 5a, and in that case, it is more preferable to provide a spacer layer 11 between the electron transit layer 5a and the electron supply layer 5b.

The compound semiconductor substrate Z of the present invention can be manufactured by using a known method. Suitable examples thereof may include a metal organic chemical vapor deposition (MOCVD), but other vapor phase growth method, for example, a hydride vapor phase epitaxy (the HVPE) method or a molecular beam epitaxy (MBE) method may be used. Furthermore, these respective growth methods may be timely used in combination.

Figure 2:
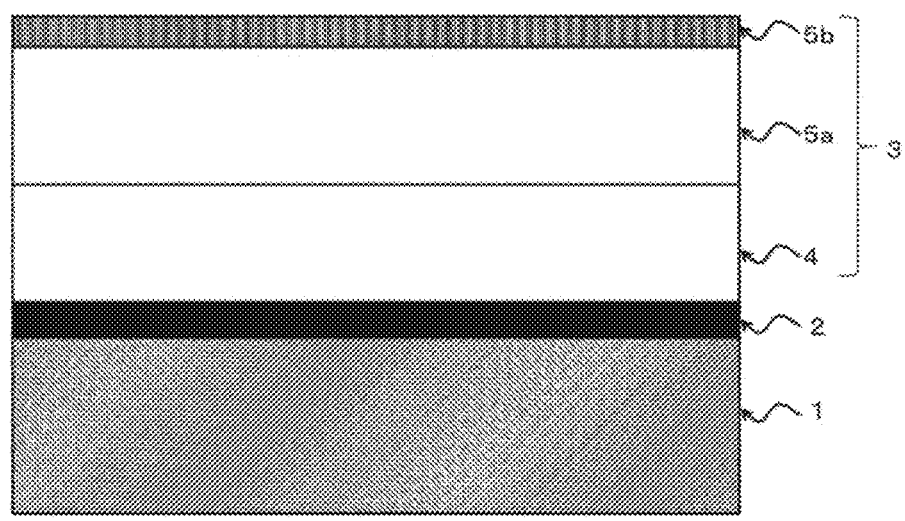
FIG. 2 is a cross-sectional schematic diagram which illustrates another embodiment of a compound semiconductor substrate according to the present invention.

Hereinafter, the present invention will be described by using FIG. 2 in more detail with regard to the compound semiconductor substrate Z, which is a preferred embodiment of the present invention, and in which the ground substrate 1 is AlN, the seed layer 2 is a silicon (Si) single crystal manufactured by the CZ method or the FZ method, the compound semiconductor layer 3 is a gallium-based nitride manufactured by a vapor phase growth method, the active layer 5 is one in which the electron supply layer 5b is formed on the electron transit layer 5a, and the FWHM of the GaN (002) and GaN (100) X-ray diffraction peaks of the buffer layer 4 are both 500 arcsec or less.

Here, examples of the compound semiconductor layer 3 composed of a gallium-based nitride may include a multilayer structure consisting of a combination of a layer formed of essentially GaN and at least either of AlGaN or InGaN and other layers of AlN, InN, and the like.

In general, the sheet resistance of the electron transit layer 5a increases when there is a factor that scatters electrons, such as a dopant or a crystal defect in its portion. Hence, it is preferable that the electron transit layer 5a have a high purity and high crystalline quality, and thus it is also preferable that the sheet resistance thereof be lower.

For example, in a gallium-based nitride semiconductor film deposited on a Si substrate, the sheet resistance value of the non-doped electron transit layer 5a is preferably about from 400 to 450Ω/□. Incidentally, the electric resistance of the electron transit layer 5a is often evaluated by the sheet resistance value, and this is also applied to the present invention.

It is required to lower the FWHM of the buffer layer 4 in order to obtain a low sheet resistance value of the electron transit layer 5a, but a micrometer-order layer thickness is required in order to achieve this FWHM in the case of employing a different kind of substrate, and it is required to appropriately use a stress control layer in the deposition step in order to suppress warpage or cracks.

On the other hand, in the present invention, in order to realize a low FWHM value of the buffer layer 4, the stress control layer can be eliminated or decreased as possible and it is possible to increase the thickness of the active layer 5 through a simple structure by limiting the thermal expansion difference between the ground substrate 1 and the compound semiconductor layer 3, specifically, by setting the thermal expansion coefficient of the sintered body constituting the ground substrate 1 to be 0.7 times or more and 1.4 times or less the average thermal expansion coefficient of the entire compound semiconductor layer 3.

Furthermore, when the buffer layer 4, the electron transit layer 5a, and the electron supply layer 5b are all a gallium-based nitride semiconductor, it is possible to significantly decrease the sheet resistance value of the electron transit layer 5a and to suitably obtain a sheet resistance value of 400Ω/□ or less by setting both the FWHM of the GaN (002) and GaN (100) X-ray diffraction peaks of the buffer layer 4 to 500 arcsec or less.

That is, in the present invention, it has been found out that the sheet resistance value of the electron transit layer 5a is affected even by the properties of the buffer layer 4 that is present below the electron transit layer 5a and further the seed layer 2 and the ground substrate 1 that are present below the buffer layer 4, and these are appropriately defined as the method for lowering the sheet resistance value of the electron transit layer 5a.

Figure 3:
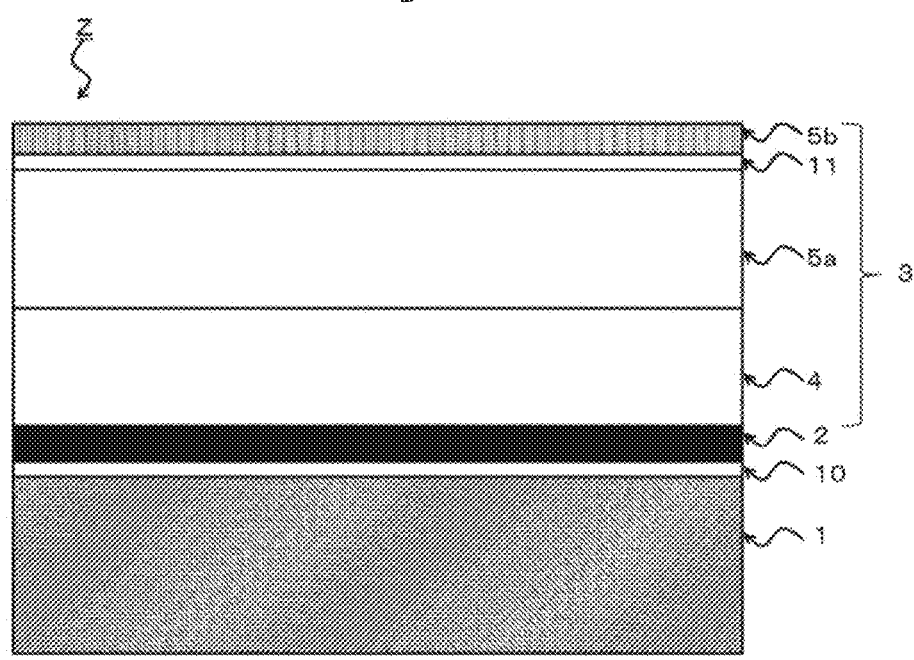
FIG. 3 is a cross-sectional schematic diagram which illustrates a more preferred another embodiment of a compound semiconductor substrate according to the present invention.

In addition, as illustrated in FIG. 3, it is even more preferable to further provide the spacer layer 11 between the electron transit layer 5a and the electron supply layer 5b since the carrier mobility improving effect by the spacer layer 11 is promoted by a decrease in sheet resistance value of the electron transit layer 5a.

It is possible to apply known material, composition, and thickness to the spacer layer 11. For example, an AlN spacer layer 11 having a thickness of about from 0.5 to 2 nm is suitable in a case in which the electron transit layer 5a is GaN and the electron supply layer 5b is AlGaN.

In addition, as illustrated in FIG. 3, a bonding layer 10 may be interposed between the ground substrate 1 and the seed layer 2. The ground substrate 1 and the seed layer 2 which are composed of different materials from each other are more robustly bonded when there is the bonding layer 10.

It is possible to apply a known technology and material to the bonding layer 10, but in the present invention, a layer composed of an oxide of the material constituting the seed layer 2 is more preferable. The oxide is superior in adhesion to the material constituting the seed layer 2 so that it is suitable as the bonding layer 10.

Here, it is more preferable that an oxide film be formed by directly oxidizing the surface of the seed layer 2 since the seed layer 2 and the bonding layer 10 are originally strongly bonded to each other and thus it is less concerned that the layer is peeled off from the substrate in the process of polishing.

In addition, the back surface of the ground substrate 1 may be subjected to mirror polishing, and the surface other than the region in which the seed layer 2 is formed may be covered with a protective film such as an oxide film.

Incidentally, the HEMT structure has been described as an example so far, but the compound semiconductor substrate Z according to the present invention can also be applied to alight emitting diode other than the HEMT structure as long as it has a semiconductor structure in which a decrease in resistance of the active layer contributes to the improvement of properties.

As described above, the compound semiconductor substrate Z according to the present invention enables the improvement of properties of the active layer that has been impossible to be easily achieved in the prior art by a relatively simple configuration.

The present invention is effective even in a compound semiconductor substrate having a diameter of 6 inches or more particularly in view of the fact that it is significantly difficult to control the warpage of the entire substrate in an extension of the prior art when fabricating a compound semiconductor substrate for HEMT which has a diameter of 6 inches or more and a thickness of the compound semiconductor layer 3 of 7 μm or more. Furthermore, in a compound semiconductor substrate having a diameter of 8 inches, it is possible to provide a compound semiconductor substrate which includes an electron transit layer having a warpage level and a low resistance that cannot be achieved by the technique of the prior art which does not employ a single crystal in the ground substrate 1 and the seed layer 2.

EXAMPLES

Hereinafter, the present invention will be specifically described with reference to Examples, but the present invention is not limited to the following Examples.

Example 1 Fabrication of Sample 1

(Preparation of Ground Substrate 1)

A substrate composed of an AlN sintered body having a diameter of 6 inches and a thickness of 1000 μm was prepared, and this was used as the ground substrate 1. Both surfaces of this ground substrate were mirror-finished so as to have an arithmetic average roughness Ra=50 nm or less.

(Preparation for Manufacturing Seed Layer 2)

A Si single crystal substrate having a diameter of 6 inches, a thickness of 675 μm, a plane orientation (111), and a specific resistance of 0.002 Ω·cm was prepared, one surface of this was mirror-finished so as to have an arithmetic average roughness Ra=50 nm or less, and this was subsequently subjected to the oxidation treatment for 2 hours at 1000° C. in a 100% oxygen atmosphere by using a heat treatment furnace for semiconductor, and the substrate thus obtained was used as the base of the seed layer 2.

(Bonding and Processing of Ground Substrate 1 and Base of Seed Layer 2)

The mirror surfaces of the ground substrate 1 and the base of the seed layer 2 fabricated as described above were bonded to each other through thermocompression by a known method, and the base of the seed layer 2 was then surface ground until having a thickness of 0.5 μm and finally mirror-finished having an arithmetic average roughness Ra=50 nm or less so as to use the resultant as the seed layer 2, thereby giving a bonded body of the ground substrate 1 and the seed layer 2.

(Formation of Compound Semiconductor Layer 3, 1: Initial Layer)

The bonded body was wet-cleaned by a known substrate wet-cleaning method, then set in a MOCVD apparatus, and subjected to a heat treatment for 15 minutes at 1000° C. in a 100% hydrogen atmosphere after the temperature was raised. Subsequently, a first initial layer composed of an AlN single crystal having a thickness of 100 nm was subjected to vapor phase growth at 1000° C. by using trimethylaluminum (TMA) and ammonia ($NH_3$) as source gases. The reference growth temperature was set to 1000° C. and fine adjustment in a range of from 1 to 15° C. was added to this in the formation of all the subsequent gallium-based nitride semiconductor layers. A second initial layer composed of an $Al_xGa_{1-x}N$ single crystal layer (x=0.1) having a thickness of 100 nm was grown on the initial layer by using trimethyl gallium (TMG), TMA, and $NH_3$ as source gases.

(Formation of Compound Semiconductor Layer 3, 2: Formation of Buffer Layer)

Next, a GaN single crystal layer having a carbon concentration of $1\times10^{16}$ atoms/$cm^3$ and a thickness of 4800 nm and a GaN single crystal layer having a carbon concentration of $5\times10^{19}$ atoms/$cm^3$ and a thickness of 3600 nm were sequentially stacked on the second initial layer, and this was used as the buffer layer 4.

(Formation of Compound Semiconductor Layer 3, 3: Formation of Electron Transit Layer and Electron Supply Layer)

Subsequently, a GaN single crystal layer having a carbon concentration of $1\times10^{16}$ atoms/$cm^3$ and a thickness of 700 nm was stacked thereon in the same manner as the electron transit layer 5a, further an $Al_yGa_{1-y}N$ single crystal layer (y=0.25) having a thickness of 20 nm was stacked thereon in the same manner as the electron supply layer 5b. Incidentally, the control of the thickness or carbon concentration of each layer formed by vapor phase growth was conducted by adjusting the flow rate and supply time of the source gas, the substrate temperature, and other known growth conditions. One that was fabricated in this manner was used as Sample 1.

A sample obtained by depositing until the buffer layer 4 but without forming the electron transit layer 5a and the electron supply layer 5b was separately prepared, and this was used as Sample $1_X$.

Example 2 Fabrication of Sample 2

The whole process was the same as that in Example 1 except that the step of fabricating the buffer layer 4 in Example 1 was replaced by the step of forming the buffer layer 4 having a multilayer structure in which an AlN single crystal layer having a carbon concentration $5 \times 10^{19}$ atoms/cm$^3$ and a thickness of 5 nm and a GaN single crystal layer having a carbon concentration of $5 \times 10^{19}$ atoms/cm$^3$ and a thickness of 30 nm were alternately grown so as to be 8 layers for each, subsequently, a GaN single crystal layer having a carbon concentration $5 \times 10^{19}$ atoms/cm$^3$ and a thickness of 8120 nm was stacked thereon in the same manner. One that was fabricated in this manner was used as Sample 2.

A sample obtained by depositing until the buffer layer 4 was separately prepared, and this was used as Sample $2_X$.

Comparative Example 1 Fabrication of Sample 3

The whole process was the same as that in Example 2 except that the Si single crystal substrate used in the fabrication of the seed layer 2 was used as it was instead of the ground substrate 1 and the seed layer 2 in Example 2. One that was fabricated in this manner was used as Sample 3. A sample obtained by depositing until the buffer layer 4 was separately prepared, and this was used as Sample $3_X$.

Comparative Example 2 Fabrication of Sample 4

The Si single crystal substrate used in the fabrication of the seed layer 2 was used as it was instead of the ground substrate 1 and the seed layer 2. In the step of fabricating the buffer layer 4, an AlN single crystal layer having a carbon concentration $5 \times 10^{19}$ atoms/cm$^3$ and a thickness of 5 nm and a GaN single crystal layer having a carbon concentration of $5 \times 10^{19}$ atoms/cm$^3$ and a thickness of 30 nm were alternately grown so as to be 8 layers for each, subsequently as Step A, a GaN single crystal layer of 225 nm was grown and the AlN single crystal layer having a thickness of 5 nm and the GaN single crystal layer having a thickness of 30 nm (both having a carbon concentration of $5 \times 10^{19}$ atoms/cm$^3$) were grown again so as to be 8 layers for each. This Step A was repeated three times. Thereafter, a GaN single crystal layer having a carbon concentration of $5 \times 10^{19}$ atoms/cm$^3$ and a thickness of 1300 nm was stacked thereon in the same manner, thereby forming the buffer layer 4 having a multilayer structure. The whole process since the formation of the electron transit layer 5a was the same as that in Example 1. One that was fabricated in this manner was used as Sample 4.

A sample obtained by depositing until the buffer layer 4 was separately prepared, and this was used as Sample $4_X$.

[Evaluation]

The Samples 1 to 4 fabricated in Examples 1 and 2 and Comparative Examples 1 and 2 were subjected to the evaluation on the warpage of the entire compound semiconductor substrate Z, the crystallinity of the buffer layer 4, and the sheet resistance value of the electron transit layer 5a. The warpage was determined by the difference between the maximum value and the minimum value of the distance in which the substrate surface in the main surface center was displaced in the substrate thickness direction by using a commercially available laser displacement meter. The crystallinity was evaluated by the FWHM of the rocking curve of the (002) and (100) plane peaks that were respectively obtained by X-ray diffraction by using Samples $1_X$ to $4_X$. The sheet resistance was measured at 1 point in the center of the surface of Samples 1 to 4 by using a Hall effect measurement apparatus.

The amount of warpage in Sample 1 was 30 µm, the amount of warpage in Sample 2 was 10 µm, and the amount of warpage in Comparative Example 4 was 50 µm. Here, in Samples 1, 2, and 4, cracking of the film did not occur and there was no problem in the substrate shape and appearance when the appearance of the substrate within 3 mm from the periphery was not considered, but cracking of the film occurred over the entire surface in Sample 3 so as not to be able to conduct the evaluation. Moreover, the results for the sheet resistance evaluation were as follows. The sheet resistance was 220Ω/□ in Sample 1, 380Ω/□ in Sample 2, and 450Ω/□ in Sample 4.

On the other hand, in Samples $1_X$ to $4_X$, the FWHM of GaN (002) and GaN (100) were respectively 250 arcsec and 300 arcsec in Sample $1_X$, respectively 400 arcsec and 800 arcsec in Sample $2_X$, and respectively 550 arcsec and 1000 arcsec in Sample $4_X$. As described above, cracks formed in the film over the entire surface in Sample $3_X$ so as not to be able to conduct the evaluation.

As described above, Samples 1 and 2 within the embodiment of the present invention have a lower sheet resistance as compared to Sample 4 in which a sintered body is not used as the ground substrate. In particular, the sheet resistance of the electron supply layer in Sample 1 is decreased by from 40 to 45% as compared to that in Sample 4 in which a nitride semiconductor layer is formed on a Si single crystal substrate of the prior art.

In addition, the warpage of both Samples 1 and 2 is in a practically acceptable level. That is, it indicates that the warpage of thick Samples 1 and 2 in which the thickness of the compound semiconductor layer is from 7 to 10 µm is in a level equal to that of Sample 4 in which the thickness of the compound semiconductor layer is from 4 to 5 µm, and thus it can be said that the warpage decreasing effect that is one of the features of the present invention is exerted.

What is claimed is:

1. A compound semiconductor substrate comprising:
    a compound semiconductor layer formed on one main surface of a ground substrate via a seed layer, wherein
    the ground substrate is formed of a sintered body,
    the seed layer is formed of a single crystal,
    the compound semiconductor layer includes a structure having a buffer layer and an active layer that are sequentially crystal-grown on the seed layer,
    a thermal expansion coefficient of the sintered body is 0.7 times or more and 1.4 times or less an average thermal expansion coefficient of the entire compound semiconductor layer, and
    an FWHM of an X-ray diffraction peak of the buffer layer is 800 arcsec or less, and a layer thickness of the compound semiconductor layer is 7 µm or more and 15 µm or less.

2. The compound semiconductor substrate according to claim 1, wherein the active layer is one obtained by forming an electron supply layer on an electron transit layer.

3. The compound semiconductor substrate according to claim 2, wherein a spacer layer is further provided between the electron transit layer and the electron supply layer.

4. The compound semiconductor substrate according to claim 1, wherein
    the ground substrate is an aluminum nitride (AlN) sintered body, the seed layer is a silicon (Si) single crystal manufactured by the Czochralski (CZ) method or the Floating Zone (FZ) method, the compound semiconductor is a gallium-based nitride manufactured by a vapor phase growth method, and the FWHM of GaN (002) and GaN (100) X-ray diffraction peaks of the buffer layer are both 500 arcsec or less.

5. The compound semiconductor substrate according to claim 2, wherein the ground substrate is an aluminum nitride (AlN) sintered body, the seed layer is a silicon (Si) single crystal manufactured by the Czochralski (CZ) method or the Floating Zone (FZ) method, the compound semiconductor is a gallium-based nitride manufactured by a vapor phase growth method, and the FWHM of GaN (002) and GaN (100) X-ray diffraction peaks of the buffer layer are both 500 arcsec or less.

6. The compound semiconductor substrate according to claim 3, wherein the ground substrate is an aluminum nitride (AlN) sintered body, the seed layer is a silicon (Si) single crystal manufactured by the Czochralski (CZ) method or the Floating Zone (FZ) method, the compound semiconductor is a gallium-based nitride manufactured by a vapor phase growth method, and the FWHM of GaN (002) and GaN (100) X-ray diffraction peaks of the buffer layer are both 500 arcsec or less.

* * * * *